(12) United States Patent
Tanaka et al.

(10) Patent No.: US 7,741,412 B2
(45) Date of Patent: Jun. 22, 2010

(54) CURABLE ORGANOPOLYSILOXANE COMPOSITION

(75) Inventors: Miyuki Tanaka, Annaka (JP); Kazuyasu Sato, Usui-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 133 days.

(21) Appl. No.: 11/145,930

(22) Filed: Jun. 7, 2005

(65) Prior Publication Data

US 2005/0272893 A1 Dec. 8, 2005

(30) Foreign Application Priority Data

Jun. 8, 2004 (JP) .............................. 2004-169533

(51) Int. Cl.
C08L 83/04 (2006.01)

(52) U.S. Cl. ................... 525/477; 525/478; 524/267; 524/268; 524/430; 524/588; 528/15; 528/31; 528/32

(58) Field of Classification Search ................. None
See application file for complete search history.

(56) References Cited

U.S. PATENT DOCUMENTS

| | | | | |
|---|---|---|---|---|
| 5,096,990 | A * | 3/1992 | Takayanagi et al. | 528/15 |
| 5,597,853 | A * | 1/1997 | Itoh et al. | 523/213 |
| 6,111,221 | A * | 8/2000 | Miyakoshi et al. | 219/216 |
| 6,265,480 | B1 * | 7/2001 | Enami et al. | 524/588 |
| 6,713,586 | B2 * | 3/2004 | Greene | 528/34 |
| 2002/0016019 | A1 | 2/2002 | Ikeno | |

FOREIGN PATENT DOCUMENTS

| | | |
|---|---|---|
| EP | 0 821 038 A2 | 1/1998 |
| EP | 0 939 440 A2 | 9/1999 |
| JP | 63-35654 | 2/1988 |
| JP | 63-246856 | 10/1988 |
| JP | 11-194643 | 7/1999 |
| JP | 11-243100 | 9/1999 |
| JP | 2003-213134 | 7/2003 |
| JP | 2005-344106 | 12/2005 |

OTHER PUBLICATIONS

U.S. Appl. No. 12/233,781, filed Sep. 19, 2008, Tanaka, et al.

* cited by examiner

*Primary Examiner*—Marc S Zimmer
(74) *Attorney, Agent, or Firm*—Oblon, Spivak, McClelland, Maier & Neustadt, L.L.P.

(57) ABSTRACT

A curable organopolysiloxane composition is provided, which includes (A) an organopolysiloxane containing at least one silicon atom-bonded alkenyl group within each molecule, (B) an organohydrogenpolysiloxane, which contains, within each molecule, at least one silicon atom-bonded hydrogen atom at a molecular chain terminal, and at least two silicon atom-bonded hydrogen atoms at non-terminal positions within the molecular chain, and which satisfies the formula shown below:

$$0 < \alpha/\beta \leq 0.25$$

(wherein, $\alpha$ represents the number of silicon atom-bonded hydrogen atoms at non-terminal positions within the molecular chain, and $\beta$ represents the total number of silicon atoms within the component (B)), in sufficient quantity to provide from 0.1 to 5 silicon atom-bonded hydrogen atoms per silicon atom-bonded alkenyl group within the component (A), and (C) a platinum-based catalyst. The composition can be cured even at low temperatures, generates a cured product that suffers no surface wrinkling, and displays excellent storage characteristics.

24 Claims, No Drawings

CURABLE ORGANOPOLYSILOXANE COMPOSITION

BACKGROUND OF THE INVENTION

1. Field of the Invention

The present invention relates to an organopolysiloxane composition which generates a cured product via an organopolysiloxane addition reaction, and is particularly useful for protecting ICs and hybrid ICs, and sealing power modules and the like.

2. Description of the Prior Art

Silicone gels and silicone potting materials are addition reaction curable organopolysiloxane compositions which comprise an organohydrogenpolysiloxane containing hydrogen atoms bonded to silicon atoms (namely, SiH groups), an organopolysiloxane containing alkenyl groups such as vinyl groups bonded to silicon atoms, and a platinum-based catalyst, and which yield a cured product via an addition reaction of the SiH groups to the vinyl groups or other alkenyl groups. These silicone gels and silicone potting materials display excellent levels of heat resistance, weather resistance, oil resistance, low-temperature resistance, and electrical insulation, and also display low elastic modulus values and low levels of stress, and as a result, they are widely used in the protection of vehicle-mounted electronic components and household electronic appliance components (patent reference 1). In recent years, due to decreases in the heat resistant temperature of electronic components and the heat resistant temperature of substrates and casings used for mounting such electronic components, and decreases in the internal thermal stress caused by the difference between the temperature during curing and the temperature during use, reductions in the curing temperature for silicone materials to temperatures below conventional levels are now being sought. Moreover, shorter curing times are also being demanded. In addition, from the viewpoint of workability, one-part compositions are preferred to two-part compositions. However, it is well known that reducing the curing temperature and enabling shorter curing times causes a marked deterioration in the storage characteristics of one-part compositions. Moreover, it is also known that low temperature curing promotes wrinkling of the surface of the silicone cured product.

Typically known methods for improving the storage characteristics of a one-part composition include increasing the quantity of reaction retarding agent, or altering the nature of the reaction retarding agent, but when either of these methods is adopted, curing at low temperature becomes impossible. Low temperature curing can be achieved by using a reaction retarding agent with a comparatively low boiling point, but this can cause a deterioration in the storage characteristics of the one-part composition, as well as increasing the likelihood of wrinkling occurring on the surface of the cured product during curing, and increasing the danger of a deterioration in the durability of a product filled with the silicone composition.

Accordingly, the development of a curable organopolysiloxane composition that is capable of resolving the above problems, whether used as a one-part composition or as a two-part (or greater) composition, has been keenly sought.

[Patent Reference 1]
US Patent Publication No. 2002/0016019A

SUMMARY OF THE INVENTION

The present invention takes the above circumstances into consideration, with an object of providing a curable organopolysiloxane composition which can be cured even at low temperatures, generates a cured product that suffers no surface wrinkling, and displays excellent storage characteristics.

As a result of intensive investigations aimed at achieving the object described above, the inventors of the present invention discovered that a curable organopolysiloxane composition described below was able to be cured at low temperatures, and generated no wrinkling on curing.

In other words, the present invention provides a curable organopolysiloxane composition comprising:

(A) an organopolysiloxane containing at least one alkenyl group bonded to a silicon atom within each molecule, represented by an average composition formula (1) shown below:

$$R_a R^1_b SiO_{(4-a-b)/2} \quad (1)$$

(wherein, R represents an alkenyl group, $R^1$ represents a substituted or unsubstituted monovalent hydrocarbon group that contains no aliphatic unsaturated bonds, a represents a number from 0.0001 to 0.2, b represents a number from 1.7 to 2.2, and a+b represents a number within a range from 1.9 to 2.4), (B) an organohydrogenpolysiloxane, which contains, within each molecule, at least one hydrogen atom bonded to a silicon atom at a molecular chain terminal, and at least two hydrogen atoms bonded to non-terminal silicon atoms within the molecular chain, and which satisfies a formula (2) shown below:

$$0 < \alpha/\beta < 0.25 \quad (2)$$

(wherein, α represents the number of hydrogen atoms bonded to non-terminal silicon atoms within the molecular chain, and β represents the total number of silicon atoms within the component (B), in sufficient quantity to provide from 0.1 to 5 hydrogen atoms bonded to silicon atoms within this component (B) per alkenyl group bonded to a silicon atom within the component (A), and (C) an effective quantity of a platinum-based catalyst.

A curable organopolysiloxane of the present invention can be cured within a short time, even at low temperatures, generates a cured product (silicone rubber, silicone gel) without the occurrence of surface irregularities such as wrinkling, and displays superior storage characteristics. In addition, the composition is very unlikely to develop internal stress or cracking caused by heat history or the like following curing. Accordingly, the composition can be used favorably for the protection of ICs, hybrid ICs, and power modules.

DETAILED DESCRIPTION OF THE PREFERRED EMBODIMENTS

A composition of the present invention comprises the components (A) through (C) described above, and may also comprise other optional components. As follows is a detailed description of each of these components. In this description, viscosity values represent values measured at 25° C.

[(A) Organopolysiloxane]

The component (A) of a composition of the present invention is the primary component (the base polymer) of the composition. This component (A) is represented by the average composition formula (1) shown above, and is an organopolysiloxane containing at least one alkenyl group bonded to a silicon atom (in this description, also described as a silicon atom-bonded alkenyl group) within each molecule. This component preferably contains at least 2, and even more preferably from 2 to 50, and most preferably from 2 to 20, of these alkenyl groups within each molecule. These alkenyl groups may be bonded to the silicon atoms at the molecular chain terminals, to silicon atoms at non-terminal positions within the molecular chain (that is, away from the molecular chain terminals), or at both of these positions.

In the above formula (1), R represents an alkenyl group, typically of 2 to 6, and preferably 2 to 4, carbon atoms. Specific examples of the alkenyl group include lower alkenyl groups such as a vinyl group, allyl group, propenyl group, isopropenyl group, butenyl group, or isobutenyl group, although a vinyl group is preferred. Each $R^1$ group represents a substituted or unsubstituted monovalent hydrocarbon group that contains no aliphatic unsaturated bonds, and this group typically contains from 1 to 10, and preferably from 1 to 6, carbon atoms. Specific examples of such groups include alkyl groups such as methyl groups, ethyl groups, propyl groups, isopropyl groups, butyl groups, isobutyl groups, tert-butyl groups, pentyl groups, hexyl groups, cyclohexyl groups, octyl groups, decyl groups, and dodecyl groups; aryl groups such as phenyl groups and tolyl groups; aralkyl groups such as benzyl groups and phenylethyl groups; and groups in which a portion of, or all of, the hydrogen atoms within these groups have been substituted with a halogen atom such as a fluorine or chlorine atom, including chloromethyl groups and 3,3,3-trifluoropropyl groups. Of these, methyl groups, phenyl groups, and 3,3,3-trifluoropropyl groups are particularly preferred in terms of ease of synthesis.

In the formula (1), a is preferably a number from 0.0005 to 0.1, b is preferably a number from 1.9 to 2.0, and a+b is preferably a number within a range from 1.95 to 2.05.

There are no particular restrictions on the molecular structure of the organopolysiloxane of this component, and straight chain structures; branched structures comprising $RSiO_{3/2}$ units, $R^1SiO_{3/2}$ units and $SiO_2$ units (wherein, the groups represented by R and $R^1$ are as defined above) at portions within the molecular chain; cyclic structures; and three dimensional network (resin) structures are all suitable, although typically, the organopolysiloxane is a straight chain diorganopolysiloxane, in which the principal chain basically comprises repeating diorganosiloxane units, and both molecular chain terminals are blocked with triorganosiloxy groups.

The viscosity of the organopolysiloxane of this component is preferably within a range from 50 to 100,000 mPa·s, and even more preferably from 100 to 10,000 mPa·s. If this viscosity falls within the range from 50 to 100,000 mPa·s, then the strength, flowability, and workability of the resulting cured product are superior.

Examples of organopolysiloxanes of this component that satisfy the requirements described above include the organopolysiloxanes represented by a general formula (1a) shown below:

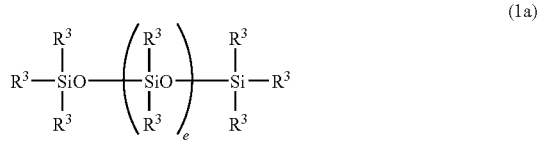

(wherein, each $R^3$ group represents, independently, a substituted or unsubstituted monovalent hydrocarbon group, provided at least one of the $R^3$ groups is an alkenyl group, and e represents an integer from 20 to 2,000). In this formula (1a), the substituted or unsubstituted monovalent hydrocarbon groups represented by $R^3$ are the same as those defined above for the group R (the alkenyl group) and the group $R^1$ (the substituted or unsubstituted monovalent hydrocarbon group that contains no aliphatic unsaturated bonds), and the number of carbon atoms within the group, and specific examples of the group are as described above. Furthermore, e is preferably an integer within a range from 40 to 1,200, and even more preferably from 50 to 600.

Specific examples of organopolysiloxanes represented by the above formula (1a) include dimethylpolysiloxane with both molecular chain terminals blocked with dimethylvinylsiloxy groups, dimethylpolysiloxane with one molecular chain terminal blocked with a trimethylsiloxy group and the other molecular chain terminal blocked with a dimethylvinylsiloxy group, copolymers of dimethylsiloxane and methylvinylsiloxane with both molecular chain terminals blocked with trimethylsiloxy groups, copolymers of dimethylsiloxane and methylvinylsiloxane with one molecular chain terminal blocked with a trimethylsiloxy group and the other molecular chain terminal blocked with a dimethylvinylsiloxy group, copolymers of dimethylsiloxane and methylvinylsiloxane with both molecular chain terminals blocked with dimethylvinylsiloxy groups, and copolymers of dimethylsiloxane and diphenylsiloxane with both molecular chain terminals blocked with dimethylvinylsiloxy groups.

The organopolysiloxane of this component may use either a single material, or a combination of two or more different materials.

[(B) Organohydrogenpolysiloxane]

The component (B) of a composition of the present invention reacts with the aforementioned component (A), and functions as a cross-linking agent. This component (B) is an organohydrogenpolysiloxane containing, within each molecule, at least one hydrogen atom bonded to a silicon atom at a molecular chain terminal (namely, a SiH group, hereafter also referred to as a silicon atom-bonded hydrogen atom), and at least two hydrogen atoms bonded to non-terminal silicon atoms (that is, within the molecular chain), which satisfies a formula (2) shown below:

$$0<\alpha/\beta<0.25 \qquad (2)$$

(wherein, α represents the number of silicon atom-bonded hydrogen atoms at non-terminal silicon atoms within the molecular chain, and β represents the total number of silicon atoms within the component (B)). The range for the above ratio α/β preferably satisfies $0.01<\alpha/\beta<0.25$, and even more preferably $0.05 \leq \alpha/\beta \leq 0.20$, and most preferably $0.10 \leq \alpha/\beta \leq 0.20$. If the value of $\alpha/\beta \geq 0.25$, then the low temperature curability of the composition deteriorates, and the surface of the cured product becomes more prone to the occurrence of wrinkling.

There are no particular restrictions on the molecular structure of this component, provided it satisfies the requirements described above, and conventional structures such as straight chain, cyclic, branched, or three dimensional network (resin) structures are all suitable. From the viewpoints of ensuring favorable handling and workability properties for the composition, and producing a cured product with favorable properties such as mechanical strength and elongation, the number of silicon atoms within each molecule (or the polymerization degree) is typically within a range from 3 to 1,000, and preferably from 5 to 400, even more preferably from 10 to 300, even more preferably from 10 to 100, and most preferably from 10 to 60.

The viscosity of an organohydrogenpolysiloxane of this component typically falls within a range from 1 to 10,000 mPa·s, and preferably from 3 to 5,000 mPa·s, and most preferably from 5 to 3,000 mPa·s, and the component is ideally a liquid at room temperature (25° C.).

PREFERRED EMBODIMENTS

Examples of preferred organohydrogenpolysiloxanes that satisfy the above requirements include those represented by the average composition formula (3) shown below are ideal.

$$R^2_c H_d SiO_{(4-c-d)/2} \quad (3)$$

(wherein, $R^2$ represents a substituted or unsubstituted monovalent hydrocarbon group that contains no aliphatic unsaturated bonds, c represents a positive number from 0.7 to 2.2, d represents a positive number from 0.001 to 0.5, and c+d represents a number within a range from 0.8 to 2.5).

In the above formula (3), each $R^2$ group represents a substituted or unsubstituted monovalent hydrocarbon group that contains no aliphatic unsaturated bonds, and this group typically contains from 1 to 10, and preferably from 1 to 6, carbon atoms. Specific examples of such groups include alkyl groups such as methyl groups, ethyl groups, propyl groups, isopropyl groups, butyl groups, isobutyl groups, tert-butyl groups, pentyl groups, neopentyl groups, hexyl groups, cyclohexyl groups, octyl groups, nonyl groups, and decyl groups; aryl groups such as phenyl groups, tolyl groups, xylyl groups, and naphthyl groups; aralkyl groups such as benzyl groups, phenylethyl groups, and phenylpropyl groups; and groups in which a portion of, or all of, the hydrogen atoms within these groups have been substituted with a halogen atom such as a fluorine or chlorine atom, such as 3,3,3-trifluoropropyl groups. Of these, alkyl groups, aryl groups, and 3,3,3-trifluoropropyl groups are preferred, and methyl groups, phenyl groups, and 3,3,3-trifluoropropyl groups are particularly desirable.

In the above formula (3), c is preferably a number from 0.9 to 2.1, d is preferably a number from 0.002 to 0.2, and even more preferably from 0.005 to 0.1, and c+d preferably satisfies a number within a range from 1.0 to 2.3, and is preferably within a range from 1.5 to 2.2.

There are no particular restrictions on the molecular structure of an organohydrogenpolysiloxane represented by the above formula (3), and straight chain, cyclic, branched, or three dimensional network (resin) structures are all suitable. Of these, straight chain structures in which the number of silicon atoms and the viscosity fall within the respective ranges listed above are particularly preferred.

Specific examples of organohydrogenpolysiloxanes represented by the above formula (3) include copolymers of dimethylsiloxane and methylhydrogensiloxane with both molecular chain terminals blocked with dimethylhydrogensiloxy groups, copolymers of methylhydrogensiloxane, dimethylsiloxane, and diphenylsiloxane with both molecular chain terminals blocked with dimethylhydrogensiloxy groups, copolymers of dimethylsiloxane and methylhydrogensiloxane with one molecular chain terminal blocked with a dimethylhydrogensiloxy group and the other molecular chain terminal blocked with a trimethylsiloxy group, copolymers of methylhydrogensiloxane, dimethylsiloxane, and diphenylsiloxane with one molecular chain terminal blocked with a dimethylhydrogensiloxy group and the other molecular chain terminal blocked with a trimethylsiloxy group, copolymers comprising $(CH_3)_2HSiO_{1/2}$ units, $(CH_3)_3SiO_{1/2}$ units, $(CH_3)HSiO_{2/2}$ units, and $SiO_{4/2}$ units, copolymers comprising $(CH_3)_2HSiO_{1/2}$ units, $(CH_3)_3SiO_{1/2}$ units, $(CH_3)HSiO_{2/2}$ units, $(CH_3)_2SiO_{2/2}$ units, and $SiO_{4/2}$ units, copolymers comprising $(CH_3)_2HSiO_{1/2}$ units, $(CH_3)HSiO_{2/2}$ units, $(CH_3)_2SiO_{2/2}$ units, and $SiO_{4/2}$ units, copolymers comprising $(CH_3)_2HSiO_{2/2}$ units, $SiO_{4/2}$ units, $(CH_3)HSiO_{2/2}$ units, $(CH_3)_2SiO_{2/2}$ units, and $(C_6H_5)_3SiO_{1/2}$ units, and copolymers comprising $(CH_3)_2HSiO_{1/2}$ units, $(CH_3)_3SiO_{1/2}$ units, $(C_6H_5)_2SiO_{2/2}$ units, $(CH_3)HSiO_{2/2}$ units, $(CH_3)_2SiO_{2/2}$ units, and $SiO_{4/2}$ units.

The blend quantity of the component (B) is sufficient to provide from 0.1 to 5, and preferably from 0.2 to 3, and most preferably from 0.3 to 2, silicon atom-bonded hydrogen atoms within the component (B) for every silicon atom-bonded alkenyl group within the component (A). If this number of silicon atom-bonded hydrogen atoms is less than 0.1, then the cross-linking density becomes too low, meaning the composition may not cure, or may generate a cured product with poor heat resistance. In contrast, if the number of silicon atom-bonded hydrogen atoms exceeds 5, then foaming caused by a dehydrogenation reaction can become problematic, and the heat resistance may also deteriorate.

The organohydrogenpolysiloxane of this component may use either a single material, or a combination of two or more different materials.

[(C) Platinum-Based Catalyst]

The component (C) of a composition of the present invention is a component for accelerating the addition reaction between the silicon atom-bonded alkenyl groups within the component (A) and the silicon atom-bonded hydrogen atoms groups within the component (B). The component (C) is a platinum-based catalyst, or more specifically, either platinum and/or a platinum-based compound.

This platinum and/or a platinum-based compound can employ conventional materials, and specific examples include platinum black, chloroplatinic acid, alcohol modified products of chloroplatinic acid, and complexes of chloroplatinic acid with an olefin, aldehyde, vinylsiloxane or acetylene alcohol.

The blend quantity of the component (C) need only be an effective catalytic quantity, and can be increased or decreased in accordance with the desired curing rate. A typical quantity, calculated as the mass of platinum atoms relative to the mass of the component (A), is within a range from 0.1 to 1,000 ppm, with quantities from 1 to 300 ppm being preferred. If this blend quantity is too small, then the addition reaction slows markedly, and the composition may not cure at all. In contrast, if the blend quantity is too large, then not only does the heat resistance of the cured product deteriorate, but the high cost of the platinum makes the composition unviable from a cost perspective.

The platinum-based catalyst of this component may use either a single material, or a combination of two or more different materials.

[Other Optional Components]

In addition to the components (A) through (C) described above, other optional components may also be added to a composition of the present invention, provided such addition does not impair the actions and effects of the present invention.

Examples of such optional components include reaction retarding agents, inorganic fillers, heat resistance imparting agents, flame retardancy imparting agents, thixotropic imparting agents, pigments, dyes, and organopolysiloxanes that contain neither silicon atom-bonded hydrogen atoms nor silicon atom-bonded alkenyl groups (that is, organopolysiloxanes different from the components (A) and (B)).

Reaction retarding agents are components for retarding the reaction of the aforementioned composition, and specific examples include acetylene-based reaction retarding agents, amine-based reaction retarding agents, carboxylate ester-based reaction retarding agents, and phosphite ester-based reaction retarding agents.

Examples of inorganic fillers include fumed silica, crystalline silica, precipitated silica, hollow fillers, silsesquioxanes, fumed titanium dioxide, magnesium oxide, zinc oxide, iron oxide, aluminum hydroxide, magnesium carbonate, calcium carbonate, zinc carbonate, layered mica, carbon black, diatomaceous earth, and glass fibers, as well as the above types of inorganic fillers that have undergone hydrophobic surface treatment with an organosilicon compound such as an organoalkoxysilane compound, organochlorosilane compound, organosilazane compound or low molecular weight siloxane compound, and silicone rubber powders and silicone resin powders.

These optional components may be used either alone, or in combinations of two or more different materials.

[Method of Preparing Composition]

A composition of the present invention can be prepared by mixing the aforementioned components together using normal methods. A composition of the present invention can either be used as a one-pot composition, or may be divided into two or more parts if required, although one-part compositions are preferred. For example, a part comprising a portion of the component (A) and the component (C) could be mixed with a part comprising the remainder of the component (A) and the component (B). Optional components may be blended with either part. Furthermore, a composition of the present invention can be cured either at ambient temperature (25° C.), or under temperature conditions that are appropriate for the intended application.

EXAMPLES

As follows is a description of specifics of the present invention using a series of examples and comparative examples, although the present invention is in no way restricted to the examples presented below. In the following examples, "parts" and "%" values refer to "parts by mass" and "% by mass" respectively. Furthermore, penetration values of silicone gel cured products represent values measured in accordance with JIS K2220, and the hardness values of silicone rubber cured products (example 2, comparative example 5) represent values measured using an Asker C hardness tester.

Example 1

100 parts of a dimethylpolysiloxane with both molecular chain terminals blocked with dimethylvinylsiloxy groups and with a viscosity of 1,000 mPa·s (number of silicon atom-bonded alkenyl groups within each molecule: 2), 1.3 parts of a copolymer of dimethylsiloxane and methylhydrogensiloxane with both molecular chain terminals blocked with dimethylhydrogensiloxy groups and with a viscosity of 13 mPa·s, as represented by a formula (4) shown below:

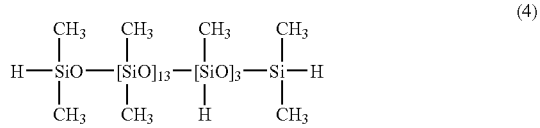

(4)

(the number of silicon atom-bonded hydrogen atoms within the component (B) per silicon atom-bonded alkenyl group within the component (A) (hereafter referred to as "silicon atom-bonded hydrogen atoms(/alkenyl group)": 0.4), 0.05 parts of a dimethylpolysiloxane solution of a chloroplatinic acid-vinylsiloxane complex containing 1% by mass of platinum atoms, and 0.05 parts of 1-ethynylcyclohexanol were mixed together uniformly, yielding a composition 1. When this composition 1 was cured by heating at 100° C. for 60 minutes, a silicone gel cured product with a penetration value of 60 was obtained.

Example 2

100 parts of a dimethylpolysiloxane with both molecular chain terminals blocked with dimethylvinylsiloxy groups and with a viscosity of 5,000 mPa·s (number of silicon atom-bonded alkenyl groups within each molecule: 2), 4.0 parts of a copolymer of dimethylsiloxane and methylhydrogensiloxane with one molecular chain terminal blocked with a dimethylhydrogensiloxy group and the other molecular chain terminal blocked with a trimethylsiloxy group, and with a viscosity of 30 mPa·s, as represented by a formula (5) shown below:

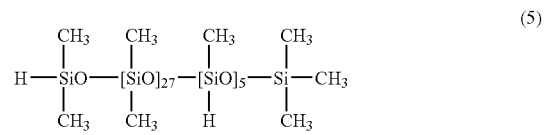

(5)

(namely, silicon atom-bonded hydrogen atoms(/alkenyl group): 0.5), 0.05 parts of a dimethylpolysiloxane solution of a chloroplatinic acid-vinylsiloxane complex containing 1% by mass of platinum atoms, and 0.08 parts of 3-methyl-1-butyn-3-ol were mixed together uniformly, yielding a composition 2. When this composition 2 was cured by heating at 80° C. for 60 minutes, a silicone rubber cured product with a hardness (Asker C) of 7 was obtained.

Example 3

100 parts of a dimethylpolysiloxane with one molecular chain terminal blocked with a trimethylsiloxy group and the other molecular chain terminal blocked with a dimethylvinylsiloxy group, and with a viscosity of 800 mPa·s (number of silicon atom-bonded alkenyl groups within each molecule: 1), as represented by a formula (6) shown below,

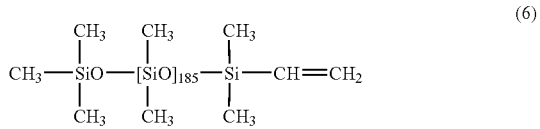

(6)

2.5 parts of a copolymer of dimethylsiloxane and methylhydrogensiloxane with both molecular chain terminals blocked with dimethylhydrogensiloxy groups and with a viscosity of 48 mPa·s, as represented by a formula (7) shown below:

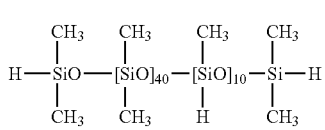

(7)

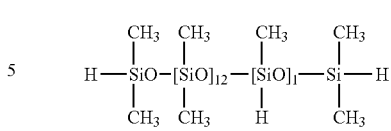

(9)

(namely, silicon atom-bonded hydrogen atoms(/alkenyl group): 1.1), 0.05 parts of a dimethylpolysiloxane solution of a chloroplatinic acid-vinylsiloxane complex containing 1% by mass of platinum atoms, and 0.05 parts of 1-ethynylcyclohexanol were mixed together uniformly, yielding a composition 3. When this composition 3 was cured by heating at 100° C. for 60 minutes, a silicone gel cured product with a penetration value of 35 was obtained.

Comparative Example 1

With the exception of replacing the copolymer of dimethylsiloxane and methylhydrogensiloxane with both molecular chain terminals blocked with dimethylhydrogensiloxy groups, represented by the above formula (4), with 1.1 parts of a copolymer of dimethylsiloxane and methylhydrogensiloxane with both molecular chain terminals blocked with trimethylsiloxy groups, as represented by a formula (8) shown below:

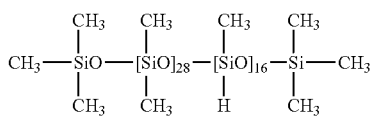

(8)

a composition C1 was prepared in the same manner as the example 1. This composition C1 was heated at 100° C. for 60 minutes, but a cured product was not obtained. The number of silicon atom-bonded hydrogen atoms(/alkenyl group) was 0.4.

Comparative Example 2

With the exception of reducing the blend quantity of 1-ethynylcyclohexanol from 0.05 parts to 0.01 parts, a composition C2 was prepared in the same manner as the comparative example 1. When this composition C2 was cured by heating at 100° C. for 60 minutes, a silicone gel cured product with a penetration value of 30 was obtained. The number of silicon atom-bonded hydrogen atoms(/alkenyl group) was 0.4.

Comparative Example 3

With the exception of replacing the copolymer of dimethylsiloxane and methylhydrogensiloxane with both molecular chain terminals blocked with dimethylhydrogensiloxy groups, represented by the above formula (4), with 3.8 parts of a copolymer of dimethylsiloxane and methylhydrogensiloxane with both molecular chain terminals blocked with dimethylhydrogensiloxy groups, as represented by a formula (9) shown below:

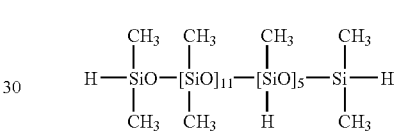

a composition C3 was prepared in the same manner as the example 1. When this composition C3 was cured by heating at 100° C. for 60 minutes, a silicone gel cured product with a penetration value of 90 was obtained. The number of silicon atom-bonded hydrogen atoms(/alkenyl group) was 0.9.

Comparative Example 4

With the exception of replacing the copolymer of dimethylsiloxane and methylhydrogensiloxane with both molecular chain terminals blocked with dimethylhydrogensiloxy groups, represented by the above formula (4), with 1.0 parts of a copolymer of dimethylsiloxane and methylhydrogensiloxane with both molecular chain terminals blocked with dimethylhydrogensiloxy groups, as represented by a formula (10) shown below:

$$\text{H}-\underset{\underset{\text{CH}_3}{|}}{\overset{\overset{\text{CH}_3}{|}}{\text{SiO}}}-[\text{SiO}]_{11}-[\text{SiO}]_5-\underset{\underset{\text{CH}_3}{|}}{\overset{\overset{\text{CH}_3}{|}}{\text{Si}}}-\text{H}$$

(10)

a composition C4 was prepared in the same manner as the example 1. When this composition C4 was cured by heating at 100° C. for 60 minutes, a silicone gel cured product with a penetration value of 50 was obtained. The number of silicon atom-bonded hydrogen atoms(/alkenyl group) was 0.5.

Comparative Example 5

With the exception of replacing the dimethylpolysiloxane with both molecular chain terminals blocked with dimethylvinylsiloxy groups from the example 2 with 1.8 parts of the copolymer of dimethylsiloxane and methylhydrogensiloxane with both molecular chain terminals blocked with dimethylhydrogensiloxy groups represented by the above formula (10), a composition C5 was prepared in the same manner as the example 2. When this composition C5 was cured by heating at 80° C. for 60 minutes, a silicone rubber cured product with a hardness (Asker C) of 8 was obtained. The number of silicon atom-bonded hydrogen atoms(/alkenyl group) was 1.6.

[Evaluation Methods]

Using the 8 different compositions 1 to 3, and C1 to C5 prepared in the above examples, the surface state of the cured product (on a glass Petri dish), the surface state of the cured product (on an aluminum Petri dish), and the storage characteristics were evaluated using the evaluation methods described below. The results are shown in Table 1.

The "cured product surface state (glass Petri dish)" was evaluated by filling glass Petri dishes of diameter 30 mm and depth 15 mm with each of the compositions, curing the compositions, and then visually evaluating the surface state of the resulting thick-film cured product.

The "cured product surface state (aluminum Petri dish)" was evaluated by dripping 2 g of each composition into an aluminum Petri dish of diameter 60 mm, curing the composition, and then visually evaluating the surface state of the resulting thin-film cured product.

The "storage characteristics" were evaluated by leaving each composition to stand for 2 weeks in an atmosphere at 40° C., and then evaluating the state of the composition. The storage characteristics were evaluated as "good", represented by the symbol "○", if the composition remained liquid, or evaluated as "poor", represented by the symbol "x", if the composition was no longer liquid.

TABLE 1

|  |  | Example | | | Comparative example | | | | |
| --- | --- | --- | --- | --- | --- | --- | --- | --- | --- |
|  |  | 1 | 2 | 3 | 1 | 2 | 3 | 4 | 5 |
|  | α | 3 | 5 | 10 | 16 | 16 | 1 | 5 | 5 |
|  | α/β | 0.17 | 0.15 | 0.19 | 0.35 | 0.35 | 0.07 | 0.28 | 0.28 |
| Hardness of cured product | penetration | 60 | — | 35 | Did not cure | 30 | 90 | 50 | — |
|  | Asker C | — | 7 | — | — | — | — | — | 8 |
| Surface state of cured product | Glass Petri dish (thick film) | No wrinkles | No wrinkles | No wrinkles | — | No wrinkles | No wrinkles | wrinkles | wrinkles |
|  | Aluminum Petri dish (thin film) | No wrinkles | No wrinkles | No wrinkles | — | No wrinkles | No wrinkles | wrinkles | wrinkles |
| Storage characteristics (40° C./2 weeks) |  | ○ | ○ | ○ | ○ | x | x | ○ | ○ |

The examples 1 to 3 satisfy the requirements of the present invention, and these compositions are able to be cured at low temperature, suffer no wrinkling on the surface of the cured product, and also display excellent storage characteristics.

In contrast, in the comparative examples 1 and 2, the organohydrogenpolysiloxane of the component (B) contains no silicon atom-bonded hydrogen atoms at the molecular chain terminals, and the α/β value does not satisfy the requirement of the present invention. The composition obtained in the comparative example 1 does not cure at low temperatures, and the composition obtained in the comparative example 2 suffers from poor storage characteristics. In the comparative example 3, the organohydrogenpolysiloxane of the component (B) contains only one silicon atom-bonded hydrogen atom at a non-terminals position within the molecular chain, which does not satisfy the requirement of the present invention, and the storage characteristics of the composition are inferior. In the comparative examples 4 and 5, the α/β value does not satisfy the requirement of the present invention, and in each case, wrinkling was detected on the surface of the cured product obtained by curing the composition.

From the above results it is evident that it is only when the requirements of the present invention are satisfied that the resulting composition can be cured within a short time, even at low temperatures, displays favorable storage characteristics, and generates a cured product that suffers no surface wrinkling.

What is claimed is:

1. A curable organopolysiloxane composition, consisting of:
    (A) an organopolysiloxane containing at least one alkenyl group bonded to a silicon atom at a molecular chain terminal within each molecule, represented by an average composition formula (1) shown below:

$$R_a R^1_b SiO_{(4-a-b)/2} \quad (1)$$

wherein, R represents an alkenyl group, $R^1$ represents a substituted or unsubstituted monovalent hydrocarbon group that contains no aliphatic unsaturated bonds, a represents a number from 0.0001 to 0.2, b represents a number from 1.7 to 2.2, and a+b represents a number within a range from 1.9 to 2.4, (B) an organohydrogenpolysiloxane, which contains, within each molecule, at least one hydrogen atom bonded to a silicon atom at a molecular chain terminal, and at least two hydrogen atoms bonded to non-terminal silicon atoms within a molecular chain, and which satisfies a formula (2) shown below:

$$0.15 \leq \alpha/\beta < 0.25 \quad (2)$$

wherein, α represents a number of hydrogen atoms bonded to non-terminal silicon atoms within a molecular chain, and β represents a total number of silicon atoms within said component (B), in sufficient quantity to provide from 0.1 to 5 hydrogen atoms bonded to silicon atoms within said component (B) per alkenyl group bonded to a silicon atom within said component (A), (C) an effective quantity of a platinum-based catalyst, and (D) at least one member selected from the group consisting of reaction retarding agents, flame retardancy imparting agents, dyes, hollow fillers, silsesquioxanes, silicone rubber powder, silicone resin powder, and inorganic fillers selected from the group consisting of fumed silica, precipitated silica, fumed titanium dioxide, magnesium oxide, zinc oxide, iron oxide, aluminum hydroxide, magnesium carbonate, calcium carbonate, zinc carbonate, layered mica, carbon black, diatomaceous earth, and glass fibers and fillers treated with a hydrophobic agent.

2. The composition according to claim 1, wherein said component (B) is represented by an average composition formula (3) shown below:

$$R^2_c H_d SiO_{(4-c-d)/2} \quad (3)$$

wherein, $R^2$ represents a substituted or unsubstituted monovalent hydrocarbon group that contains no aliphatic unsaturated bonds, c represents a number from 0.7 to 2.2, d represents a number from 0.001 to 0.5, and c+d represents a number within a range from 0.8 to 2.5.

3. The composition according to claim 1, wherein said component (B) is present in sufficient quantity to provide from 0.2 to 3 hydrogen atoms bonded to silicon atoms within said component (B) per alkenyl group bonded to a silicon atom within said component (A).

4. The composition according to claim 1, which exists as a one-part composition.

5. The composition according to claim 1, wherein component (D) is a reaction retarding agent.

6. A cured product obtained by curing a composition as defined in claim 1.

7. The composition according to claim 1, wherein said component (A) contains at least two alkenyl groups bonded to silicon atoms at a molecular chain terminal within each molecule, said composition being cured to produce a silicone gel cured product.

8. The composition according to claim 7, wherein said component (B) is represented by an average composition formula (3) shown below:

$$R^2{}_cH_dSiO_{(4-c-d)/2} \tag{3}$$

wherein, $R^2$ represents a substituted or unsubstituted monovalent hydrocarbon group that contains no aliphatic unsaturated bonds, c represents a number from 0.7 to 2.2, d represents a number from 0.001 to 0.5, and c+d represents a number within a range from 0.8 to 2.5.

9. The composition according to claim 7, wherein said component (B) is present in sufficient quantity to provide from 0.2 to 3 hydrogen atoms bonded to silicon atoms within said component (B) per alkenyl group bonded to a silicon atom within said component (A).

10. The composition according to claim 7, which exists as a one-part composition.

11. The composition according to claim 7, wherein component (D) is a reaction retarding agent.

12. A cured product obtained by curing a composition as defined in claim 7.

13. A curable organopolysiloxane composition, consisting of:

(A) an organopolysiloxane containing at least one alkenyl group bonded to a silicon atom at a molecular chain terminal within each molecule, represented by formula (1a):

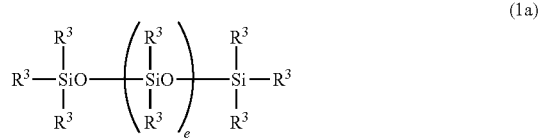

(1a)

wherein, each $R^3$ group represents, independently, a substituted or unsubstituted monovalent hydrocarbon group, provided at least one of the $R^3$ groups is an alkenyl group, and e represents an integer from 20 to 2,000;

(B) an organohydrogenpolysiloxane, which contains, within each molecule, at least one hydrogen atom bonded to a silicon atom at a molecular chain terminal, and at least two hydrogen atoms bonded to non-terminal silicon atoms within a molecular chain, and which satisfies a formula (2) shown below:

$$0.15 \leq \alpha/\beta < 0.25 \tag{2}$$

wherein, α represents a number of hydrogen atoms bonded to non-terminal silicon atoms within a molecular chain, and β represents a total number of silicon atoms within said component (B), in sufficient quantity to provide from 0.1 to 5 hydrogen atoms bonded to silicon atoms within said component (B) per alkenyl group bonded to a silicon atom within said component (A), (C) an effective quantity of a platinum-based catalyst, and (D) at least one member selected from the group consisting of reaction retarding agents, flame retardancy imparting agents, dyes, inorganic fillers selected from the group consisting of hollow fillers, silsesquioxnes, fumed silica, precipitated silica, fumed titanium dioxide, magnesium oxide, zinc oxide, iron oxide, aluminum hydroxide, magnesium carbonate, calcium carbonate, zinc carbonate, layered mica, carbon black, diatomaceous earth, glass fibers and fillers treated with a hydrophobic agent.

14. The composition according to claim 13, wherein said component (B) is represented by an average composition formula (3) shown below:

$$R^2{}_cH_dSiO_{(4-c-d)/2} \tag{3}$$

wherein, $R^2$ represents a substituted or unsubstituted monovalent hydrocarbon group that contains no aliphatic unsaturated bonds, c represents a number from 0.7 to 2.2, d represents a number from 0.001 to 0.5, and c+d represents a number within a range from 0.8 to 2.5.

15. The composition according to claim 13, wherein said component (B) is present in sufficient quantity to provide from 0.2 to 3 hydrogen atoms bonded to silicon atoms within said component (B) per alkenyl group bonded to a silicon atom within said component (A).

16. The composition according to claim 13, which exists as a one-part composition.

17. The composition according to claim 13, wherein component (D) is a reaction retarding agent.

18. A cured product obtained by curing a composition as defined in claim 13.

19. The curable organopolysiloxane composition according to claim 13, wherein in the organopolysiloxane represented by formula (1a) of component (A), at least one of the $R^3$ groups is an alkenyl group, and all of the other $R^3$ groups are methyl groups.

20. The composition according to claim 19, wherein in formula (1a), all of the $R^3$ groups representing an alkenyl group are bonded to silicon atoms at the molecular terminals.

21. The composition according to claim 19, wherein the organopolysiloxane of component (A) is selected from the group consisting of dimethylpolysiloxane with both molecular chain terminals blocked with dimethylvinylsiloxy groups, and dimethylpolysiloxane with one molecular chain terminal blocked with trimethylsiloxy group and the other molecular chain terminal blocked with a dimethylvinylsiloxy group.

22. A cured product obtained by curing a composition as defined in claim 19.

23. A curable organopolysiloxane composition, consisting of:

(A) an organopolysiloxane containing at least one alkenyl group bonded to a silicon atom at a molecular chain terminal within each molecule, represented by an average composition formula (1) shown below:

$$R_aR^1{}_bSiO_{(4-a-b)/2} \tag{1}$$

wherein, R represents an alkenyl group, $R^1$ represents a substituted or unsubstituted monovalent hydrocarbon group that contains no aliphatic unsaturated bonds, a represents a number from 0.0001 to 0.2, b represents a number from 1.7 to 2.2, and a+b represents a number within a range from 1.9 to 2.4, (B) an organohydrogenpolysiloxane, which contains, within each molecule, at least one hydrogen atom bonded to a silicon atom at a molecular chain terminal, and at least two hydrogen atoms bonded to non-terminal silicon atoms within a molecular chain, and which satisfies a formula (2) shown below:

$$0.15 \leq \alpha/\beta < 0.25 \tag{2}$$

wherein, α represents a number of hydrogen atoms bonded to non-terminal silicon atoms within a molecular chain, and β represents a total number of silicon atoms within said component (B), in sufficient quantity to provide from 0.1 to 5 hydrogen atoms bonded to silicon atoms within said component (B) per alkenyl group bonded to a silicon atom within said component (A), and (C) an effective quantity of a platinum-based catalyst.

24. A curable organopolysiloxane composition, consisting of:

(A) an organopolysiloxane containing at least one alkenyl group bonded to a silicon atom at a molecular chain terminal within each molecule, represented by an average composition formula (1a):

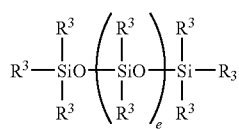
(1a)

wherein, each $R^3$ group represents, independently, a substituted or unsubstituted monovalent hydrocarbon group, provided at least one of the $R^3$ groups is an alkenyl group, and e represents an integer from 20 to 2,000;

(B) an organohydrogenpolysiloxane, which contains, within each molecule, at least one hydrogen atom bonded to a silicon atom at a molecular chain terminal, and at least two hydrogen atoms bonded to non-terminal silicon atoms within a molecular chain, and which satisfies a formula (2) shown below:

$$0.15 \leq \alpha/\beta < 0.25 \tag{2}$$

wherein, α represents a number of hydrogen atoms bonded to non-terminal silicon atoms within a molecular chain, and β represents a total number of silicon atoms within said component (B), in sufficient quantity to provide from 0.1 to 5 hydrogen atoms bonded to silicon atoms within said component (B) per alkenyl group bonded to a silicon atom within said component (A), and (C) an effective quantity of a platinum-based catalyst.

* * * * *